United States Patent [19]

Malinovski et al.

[11] 4,094,269
[45] June 13, 1978

[54] VAPOR DEPOSITION APPARATUS FOR COATING CONTINUOUSLY MOVING SUBSTRATES WITH LAYERS OF VOLATIZABLE SOLID SUBSTANCES

[75] Inventors: Yordan Petrov Malinovski; Stefan Todorov Bakardjiev; Georgi Mirchev Martinov, all of Sofia, Bulgaria

[73] Assignee: Zlafop pri Ban, Sofia, Bulgaria

[21] Appl. No.: 632,916

[22] Filed: Nov. 18, 1975

Related U.S. Application Data

[62] Division of Ser. No. 586,429, Jun. 12, 1975.

[30] Foreign Application Priority Data

Jun. 14, 1974 Bulgaria .................................. 26894

[51] Int. Cl.² .............................................. C23C 13/12
[52] U.S. Cl. ..................................... 118/49.1; 219/275
[58] Field of Search ................................. 118/48–49.5; 427/251, 50–52, 248 G, 69, 70, 248 I, 78, 91, 99, 166, 167, 107, 109; 219/271–275, 5–76

[56] References Cited

U.S. PATENT DOCUMENTS

| 1,132,687 | 3/1915 | Ryan ..................... 427/248 G |
| 2,445,310 | 7/1948 | Chilowsky ................ 118/49 X |
| 2,767,682 | 10/1956 | Smith ......................... 118/49 |
| 2,938,816 | 5/1960 | Gunther ................... 118/49 X |
| 2,940,873 | 6/1970 | Toohig ..................... 118/49 X |
| 3,136,627 | 6/1964 | Caldwell, Jr. et al. ......... 118/49.5 X |
| 3,210,525 | 10/1965 | Liben ....................... 118/49 X |
| 3,213,827 | 10/1965 | Jenkin ....................... 118/49.5 |
| 3,231,337 | 1/1966 | Barkemeyer et al. ......... 118/48 X |
| 3,260,235 | 7/1966 | Wirtz ....................... 118/49.1 |
| 3,446,936 | 5/1969 | Hanson et al. ............... 118/49.14 |
| 3,544,763 | 12/1970 | Geir Balzers ................ 118/49 X |
| 3,568,632 | 3/1971 | Cawthon ....................... 118/49 |
| 3,623,712 | 11/1971 | McNeilly et al. .............. 118/49.5 |

FOREIGN PATENT DOCUMENTS

| 59,992 | 10/1947 | Netherlands ................ 427/248 G |
| 132,299 | 7/1951 | Sweden. |
| 766,119 | 1/1957 | United Kingdom .............. 118/49 |

Primary Examiner—Morris Kaplan
Attorney, Agent, or Firm—Finnegan, Henderson, Farabow & Garrett

[57] ABSTRACT

Apparatus for the vapor deposition of volatizable solid substances on continuously moving substrates, more particularly for the production of photographic materials by vapor deposition of silver halides on continuosly moving substrates, is constructed so as to prevent direct contact between heating means for a crucible for the solid substance and the solid substance therein and to enable a stream of vapor of the solid substance to be produced which is of high intensity enabling a high rate of growth of the deposited layer to occur.

5 Claims, 3 Drawing Figures

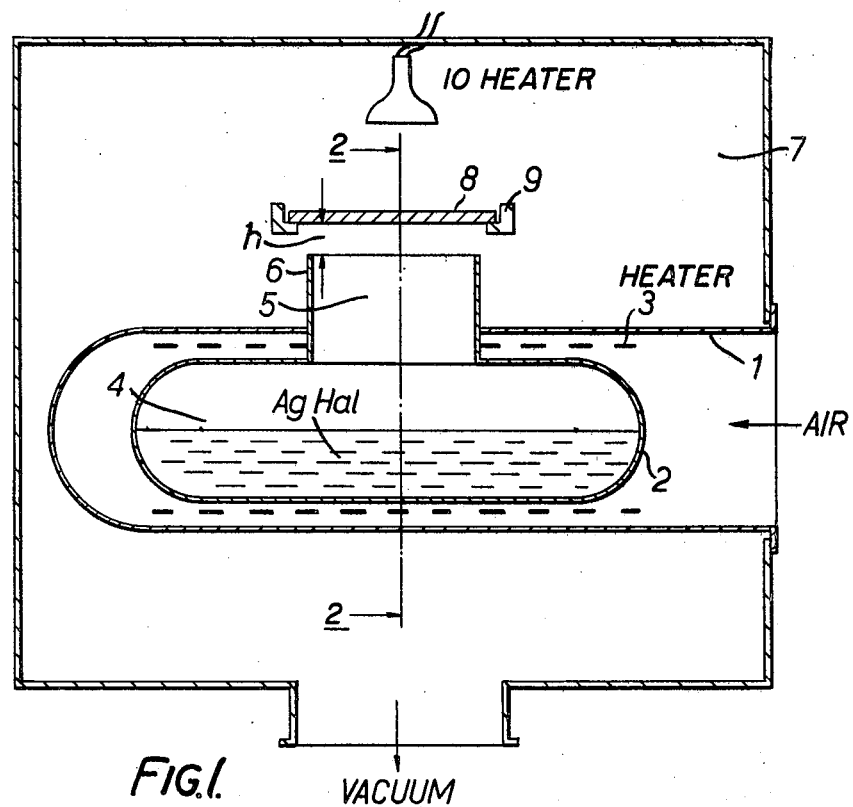
FIG.1.
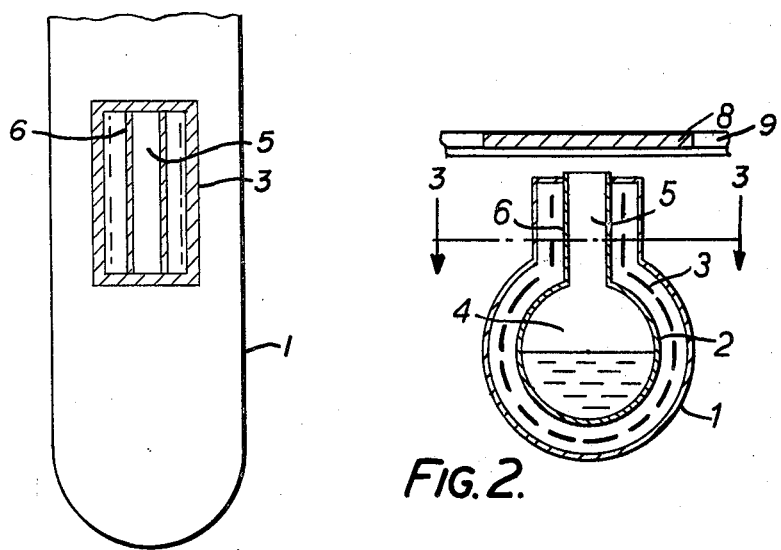
FIG.2.
FIG.3.

VAPOR DEPOSITION APPARATUS FOR COATING CONTINUOUSLY MOVING SUBSTRATES WITH LAYERS OF VOLATIZABLE SOLID SUBSTANCES

CROSS-REFERENCE TO RELATED APPLICATION

This application is a divisional from our co-pending application Ser. No. 586,429 filed June, 12th 1975, the disclosure of which is incorporated herein by reference.

BACKGROUND OF THE INVENTION

This invention relates to an apparatus for the vacuum evaporation of volatizable solids and their vapour deposition on a continuously moving substrate.

The idea of producing photographic materials by vacuum evaporation of silver halides has been known for a substantial time. Photographic materials prepared in this way have, in principle, considerable advantages over conventional light sensitive emulsion-coated photographic materials, namely:

1. Simple and fast processing owing to the absense of a binder;
2. High optical homogeneity reducing Raleigh scattering in the recording medium and allowing an image to be obtained which is particularly sharp;
3. A photographic material is obtained which is always thinner than the depth of focus of objectives when employing a high aperture number so that distortion of the projected image in the volume of the photographic layer is avoided;
4. High sensitivity to low energy ionizing particles and short wave ultra violet light.

These advantages are of particular value in the production of special photographic masks for use in production of microelectronic components or in systems for optical storage of information.

In spite of these advantages and the many attempts hitherto made to improving manufacturing techniques no photographic material produced by vacuum evaporation of silver halides has hitherto been entirely satisfactory. None of the methods for the production of photographic materials is entirely reproducible. This is believed to be due to the inclusion of impurities in the silver halide layers, which influence uncontrollably the properties of the silver halide layers and is generally unavoidable with apparatus hitherto employed.

Attempts have been made to reduce the impurity content of vacuum deposition-produced photographic materials and produce products with reproducible sensitivity. Thus for example in British Patent Specification No. 1,150,626, a substrate, onto which silver bromide is deposited, is cooled to $-50°$ C in order to prevent the evolution of volatile substances from the substrate, for example paper, surface contaminating the deposited silver bromide and influencing undesirably its sensitivity. In British Patent Specification No. 1,166,999 evaporation of silver bromide is carried out from a silver crucible or from a crucible of very pure, mechanically strong graphite, and the walls of the vacuum chamber employed are covered with a substance which does not react with the silver bromide, for example silver, nickel, Monel metal, glass or plastics material free from volatilizable constituents.

It is, however, well known that pure silver bromide crystals are completely insensitive and do not form, when exposed to light, a developable latent image. Reference is made here to British Patent Specification No. 1,154,741. The photographic sensitivity of silver halides is in fact due to the sensitizing action of different impurities (metal salts, sulphur compounds, etc.). The fact that the silver halide layers obtained by the methods described in British Patent Specifications Nos. 1,150,626 and 1,166,999 are light sensitive is definite proof that uncontrollable contamination of the material nevertheless occurs during the production thereof. Obviously apparatus employed hitherto cause the uncontrollable inclusion of impurities during the process of evaporation and deposition of silver halides on a substrate. Not even the method described in British Patent Specification No. 1,154,741 for doping ultra-pure light insensitive silver bromide, in which silver bromide is first vacuum deposited on a moving substrate will, in fact, yield a light-insensitive silver bromide layer on the substrate and sensitizing by subsequent doping is not reproducible.

It would therefore seem that to prepare silver halide layers having fully controllable and reproducible properties, apparatus must be devised for enabling vapour deposition of highly pure photo insensitive silver halide layers having not photographic sensitivity at all to take place. Such layers can then be subjected to deliberate and controllable sensitization to provide a material having reliable and reproducible properties.

A common feature of all the hitherto forms of apparatus is the direct contacting of the heating element of the crucible with the silver halide melt. Since a silver halide is a good ionic conductor when in the molten state, the silver halide is caused to undergo electrolytic decomposition by the current flowing through the heating element. Since thermal decomposition of silver halides is autocatalytic, the formation of electrolytic silver therefrom enhances evolution of highly reactive halogen gas, which is believed to be partially responsible for the contamination of the silver halide layers.

OBJECT OF THE PRESENT INVENTION

It is an object of the present invention to provide an apparatus for vacuum evaporation and deposition (hereinafter termed simply vacuum deposition) of solid substance layers in particular but not exclusively pure silver halide, on a continuously moving support to which has been applied a priming layer for enhancing adhesion thereto of a layer of the solid substance applied by vacuum deposition whereby uncontrollable sensitivation of the solid substance layer by impurities in the vacuum chamber is avoided, so that the product obtained has fully reproducible and controllable properties.

SUMMARY OF THE INVENTION

According to the present invention, there is provided apparatus for use in the production of a photographic material constituted by a silver halide coated substrate, which comprises an elongate crucible formed of a material which is inert when heated to an elevated temperature, crucible support means adapted both to grip the crucible and for attachment to wall means partially defining a chamber adapted for connection to vacuum producing means so that the assembled crucible, crucible support means and wall means define the chamber in which a vacuum can be produced, in use, by said vacuum producing means, the apparatus further comprising radiant heater means for substantially uniformly heating the crucible, disposed in the crucible support means and outside said chamber and means within said chamber for effecting travel of a substrate over a rectangular outlet from the crucible positioned within said chamber, the transverse cross-sectional area of the elongate crucible being at least five times the cross-sectional area of said outlet and said travel effecting means being so positioned that, in use, a said substrate will travel over said outlet with one surface thereof not more than 10 mm from the outlet, whereby silver halide vapour produced in the crucible, in use, makes contact only with heated wall means defining the crucible and the substrate.

When employing the apparatus of this invention, silver halides are placed in a crucible made out of an inert material, for example quartz, silver, or highly pure, mechanically strong graphite. The crucible is heated by a radiant heater to ensure that the whole of the crucible, including its parallel elongate walls, possesses the same temperature. This manner of heating the crucible coupled with the formation of the outlet therefrom enables an intensive stream of silver halide vapour to be directed on to the substrate. The substrate, which carries a thin priming layer, is preferably heated immediately before and during the evaporation process usually by radiant heating means positioned within the confines of the vacuum chamber but whose heating element is out of contact with the vacuum chamber, and is moved at a uniform rate above the crucible at a distance not larger than 10 mm from the hot walls of the crucible surrounding the outlet therefrom. The stream of silver halide vapour impinging directly on the substrate enables a silver halide layer to be built rapidly thereof at a rate of from 200 to 2000 A/Sec. This rapid rate of deposition especially when the substrate is at an elevated temperature prevents absorption of impurities during the deposition process and enables uniform, very pure, completely light insensitive layers of silver halide having a thickness preferably of from 0.1 to 1.5 microns, more preferably from 0.1 to 0.5 microns to be obtained. Fully controllable and reproducible sensitization of the silver halide layer by, for example, goldiridium treatment to obtain a negative imaging photographic material, or its fogging by the additional vacuum deposition of a monoatomic layer or silver or gold to obtain a positive imaging photographic material can then be effected. Other vapour deposition sensitization methods for producing both positive and negative imaging photographic materials are described in British Patent Specification No. 1,154,741. Sensitization can also be effected by conventional methods used for sensitizing conventional emulsions.

The substrate used for the production of the photographic materials in the apparatus of this invention is preferably heated in the vacuum chamber by radiant heating means prior to the deposition of the silver halide. When the substrates are glass or mica plates, they can be heated up to 200° C, whereas polyester or acetate film or plastics material-covered paper base should generally not be heated higher then 100° C. When the evaporation deposition is complete, the vacuum chamber is filled with 99.999% pure nitrogen, that is nitrogen of a purity generally required in the semi-conductor industry. In this way, micro-pores in the surface of the fresh silver halide layer produced are efficiently occupied by adsorbed very pure and photographically inactive nitrogen. In this way, any tendency for the silver halide layer to be irreproducibly sensitized by the uncontrollable adsorption of impurities occasionally present in the air is precluded.

Apparatus according to the present invention will usually be employed with an oil diffusion vacuum pump capable of maintaining in the vacuum chamber of the apparatus, a vacuum of $10^{-5}$ to $10^{-6}$ mm.Hg. In the vacuum chamber are mounted a device from which silver halide is to be evaporated, means for obtaining the uniform motion of the substrates for example a track having an associated mechanism for displacing the substrate thereover and a resistance, that is radiant, heater for heating the substrate. The vacuum chamber can be made of stainless, corrosion resistant chromium nickel steel. All other surfaces in the vacuum chamber can be formed of quartz and polytetrafluoroethylene and any electrical leads which must enter the vacuum chamber, for example for heating means for the substrate or for thermocouples for controlling the temperature of the silver halide melt, can be formed of silver or platinum. Thus the vacuum chamber will be free from substances likely to contaminate the deposited silver halide.

Although the apparatus of this invention is described herein exclusively with reference to its use in the production of photographic materials, it is emphasised that it can be used in processes in general requiring vapourisation of vacuum deposition in impurity-free manner of solid substances on continuously moving substrates.

BRIEF DESCRIPTION OF THE DRAWINGS

FIG. 1 is a vertical section through apparatus according to this invention for use in the production of a silver halide-coated substrate having no photographic response;

FIG. 2 is a vertical section taken along the lines 2—2 of FIG. 1; and

FIG. 3 is a partial horizontal section taken along the lines 3—3 of FIG. 2.

DETAILED DESCRIPTION OF THE PREFERRED EMBODIMENT

Referring to the drawing, the apparatus comprises a tube carrier 1, a crucible 2 of special shape and electric resistance heater 3.

The tube carrier 1 and the crucible 2 are formed as an integral unit out of quartz, silver, or highly pure mechanically strong graphite. The crucible is specially designed for use in the method of this invention and consists of a relatively large cylindrical body 4 having a rectangular opening into a neck section 5 formed by opposed pairs of parallel elongate walls 6, extending into a vacuum chamber 7. The cylindrical section of the crucible, is filled with silver halide and its cross-section is at least 5 times in the plane shown in FIG. 1 the magnitude of the cross-section of the neck 5. Around the crucible but outside of the vacuum chamber 7 is mounted the heater 3 which is selected to ensure uniform and controllable temperature of the contents and the walls of the crucible 2. The illustrated shape of the crucible provides a relatively large surface area of molten silver halide in the body 4 thereof and the silver halide vapour formed therefrom can be concentrated into a stream between the walls 6 of the neck 5. The concentrated stream of silver halide vapour will travel perpendicularly to a substrate 8 moving on a track 9, placed at a distance not more than 10 mm from the outlet from the neck 5. In this way a high rate of deposition of silver halide on the substrate is obtained. Even at a temperature lower than the decomposition temperature of the silver halide, a deposition rate not less than 200 A/sec can be obtained readily. The entire tube carrier is surrounded by a silver shield (not shown) and is cooled with water, and is formed with an opening providing a tight fit around the heated walls 6 of the neck 5 of the crucible 2. In this way the silver halide vapours come in contact only with the crucible and the heated substrate and there is no possibility of impurities being included in silver halide which is deposited.

Preferably substrate 8 may be heated during the evaporation process by radiant heating means positioned within the confines of vacuum chamber 7 but whose heating element is out of contact with the vacuum chamber. As embodied, this means comprises a halogen filament lamp 10, the heating element of the lamp being enclosed in a glass bulb that is out of contact with the vacuum chamber.

The following Examples illustrate the use of apparatus of the present invention in the production of photographic materials.

EXAMPLE 1

A number of glass plates were kept immersed for several hours in hot dichromate/sulphuric acid solution and were then rinsed well in deionized water. After drying they were coated by vacuum deposition with a thin layer of silicon monoxide about 0.1 micron thick. The plates thus cleaned and primed were then ready for deposition of a silver halide by the vacuum deposition method, the silicon monoxide of the priming layer being a material to which silver halide adheres well even at room temperature. The coated glass plates were used in the following three runs 1.1 to 1.3.

1.1. Apparatus of the type shown in FIG. 1 and 2 was assembled. A quartz crucible 2 was mounted in the holder 1 in such a manner that the top of the neck 5 of the crucible was 10 mm below the supporting track 9 along which the glass plates were being moved. Before assembling the apparatus, the quartz crucible was first carefully washed and then charged with silver bromide of 99.999% purity. The vacuum chamber 7 was evacuated to a pressure of less than $10^{-5}$ mm.Hg and the silver bromide was heated up to 600° C by heat emanating from the heater 3 mounted outside the vacuum chamber. A silver bromide vapour stream of high intensity, passed out of the crucible and silver bromide was deposited at a rate of about 400 A/min. The rate of travel of the glass plate was so chosen that a silver bromide layer 0.5 microns thick was built up thereon. A number of the glass plates were passed one after the other over the crucible for coating.

After cooling the crucible, the vacuum chamber was filled with pure nitrogen and after several minutes the silver bromide-coated glass plates were removed from the vacuum chamber.

1.2. The procedure of run 1.1 was repeated but using a tungsten heater inside the crucible in direct contact with the silver bromide.

1.3. In this run a conventional apparatus for vacuum deposition of silver bromide on a substrate was employed. A tungsten boat was mounted about 100 mm below a holder for the glass plates to be used. After charging the tungsten boat with silver bromide and evacuating the vacuum chamber to a pressure of less then $10^{-5}$ mm.Hg the tungsten boat was heated by connecting leads from the boat to a suitable low voltage power supply, and maintained at a temperature of about 600° C. Under these conditions it took about 10 min for a silver bromide layer 0.5 microns thick to form on the substrate. After cooling the boat and admitting air into the vacuum chamber the samples were taken out.

Samples from all three runs were exposed to a flash lamp through a sensitometric step wedge and were developed simultaneously for 40 sec in Mitchell developer having the composition:

| metol | 0.67 g |
| anhydrous sodium sulphite | 26 g |
| hydroquinone | 2.5 g |
| anhydrous sodium carbonate | 26 |
| potassium bromide | 0.67 g |
| gelatin | 1.67 g |
| water to | 1 l |

The samples were then dipped for several seconds in an acetic acid stop bath, were well rinsed with water, and dried. The densities obtained were measured on a standard densitometer.

Further samples from all three runs were subjected to gold-iridium sensitization as described by Saunders (J.Chem. Phys., 37, 1126 /1962/) using an aqueous solution containing sodium aurodithiosulphate (20 mg/1), ammonium chloroiridite (20 mg/1) and gelating (0.5 g/1). After rinsing and drying all the samples were exposed, developed and their densities were measured in the same way as the first batch of samples.

The results obtained are summarized in Table I.

TABLE I*

| Run | Treatment | Fog ($D_o$) | Maximum density ($D_{max}$) | Contrast $\gamma$ | Relative sensitivity (Srel) |
|---|---|---|---|---|---|
| 1.1 | Unsensitized | 0 | 0 | 0 | 0 |
|  | Sensitized | 0.05–0.10 | 2.50–2.70 | 1.20–1.50 | 500–600 |
| 1.2 | Unsensitized | 0.05–0.10 | 1.10–1.20 | 0.80–1.00 | 80–100 |
|  | Sensitized | 0.15–0.20 | 1.30–1.50 | 0.80–1.20 | 100–150 |
| 1.3 | Unsensitized | 0.10–0.20 | 0.80–1.20 | 0.70–1.00 | 20–100 |
|  | Sensitized | 0.20–0.30 | 1.00–1.50 | 0.80–1.00 | 50–100 |

*In all batches some samples showed inadequate adhesion. After slightly prolonged processing, marked tendency for peeling of the silver bromide layer from the glass substrate is observed.

It can be seen from Table I that the unsensitized samples of the first run 1.1 in contrast to the samples of runs 1.2 and 1.3, do not exhibit any photographic sensitivity. They can however be sensitized very successfully by the goldiridium method and then show considerably higher speed and better reproducibility than the samples prepared in run 1.2 and, especially run 1.3. The samples obtained in run 1.3 show the worst and most unreproducible parameters and are practically not influenced by the sensitization. The second run 1.2 gives more reproducible results but the sensitivity is still relatively low and cannot be much improved on by further sensitization.

EXAMPLE 2

Freshly cleaved mica was employed in place of glass as substrate material. Two runs were carried out, runs 2.1 and 2.2.

2.1 In this run a silver bromide layer was deposited onto the mica substrate by the procedure described in fun 1.1 of Example 1. During the experiment the substrates were kept at room temperature.

2.2 In the second run, prior to coating with silver bromide, the mica substrates were heated to 200° C by means of a halogen filament lamp within the vacuum chamber, the heating element of the lamp (a tungsten wire) being enclosed in a glass bulb, that is, out of contact with the vacuum chamber.

The adhesion of the silver bromide to the mica substrates was very good in each case and was not significantly affected by the substrate temperature used.

One half of the samples obtained in each run were treated by gold-iridium sensitization to yield a negative imaging photographic material as described in Example 1, while the other half of the samples in each run were fogged with silver to produce a positive imaging photographic material, as described in Example 2 of co-pending Application No. 586,429. All the samples were then exposed and processed in the manner described in Example 1. The photographic characteristics of the layers obtained are compared in Table II.

TABLE II

| Run | Treatment | $D_{min}$ | $D_{max}$ | $\gamma$ | Srel |
|---|---|---|---|---|---|
| 2.1 | Negatively sensitized | 0.05 | 2.60–2.70 | 1.10–1.20 | 400–500 |
|  | Positively sensitized | 0.10 | 2.80–3.00 | 1.50–1.70 | 40–50 |
| 2.2 | Negatively sensitized | 0.05 | 3.00 | 2.00 | 1000 |
|  | Positively | 0.10 | 2.80 | 2.50 | 300 |

It can be seen from Table II that the samples obtained by depositing silver bromide on heated mica substrates had better photgraphic parameters.

From the foregoing it can be seen that use of the apparatus of the present invention enables there to be obtained light insensitive silver halide layer coated-substrates which can subsequently be reproducibly sensitized to yield either negative or positive photographic materials because:

1. Direct contact between the heating means for the evaporator (the crucible) and the silver halide melt does not take place; otherwise the heating means would be one of the basic sources of contamination of the silver halide.

2. Conditions are created for obtaining a silver halide vapour stream of high intensity, enabling a high rate of growth of the deposited layer to occur. This high rate of growth in itself reduces the competitive adsorption of impurities in the vacuum chamber. The adsorption of impurities on the substrate is further deceased by the preliminary heating of the substrate immediately prior to the deposition of the silver halide.

We claim:

1. Apparatus for the continuous production of volatizable solid material-coated substrates which comprises wall means adapted for connection to a vacuum producing means and defining an essentially closed chamber in which the vacuum is produced by said vacuum producing means, crucible support means forming a part of said wall means and defining a recess therein, an elongated and closed crucible formed of material which is inert when heated to an elevated temperature mounted to the crucible support means outside of said chamber and substantially within said recess, the walls of the crucible support means being generally spaced from the walls of said crucible, said crucible having a rectangular neck portion extending upwardly through the crucible support means and into the chamber terminating in a restricted, rectangular outlet opening into the chamber for discharging vapor from said crucible therethrough, the interior of the crucible thereby communicating with the vacuum while the exterior of the crucible lies substantially completely outside said chamber and the transverse cross-sectional area of the elongated crucible being at least five times the cross-sectional area of the crucible outlet so that a direct collimated and rectangular beam of vapor of said solid material issues from the restricted outlet, radiant heating means located in the crucible support means and outside of the chamber for substantially uniformly heating the exterior of the crucible to vaporize solid material located therein and substrate support means located within the chamber for supporting a moving substrate during travel over said rectangular outlet of the crucible, the substrate supporting means being positioned so that the surface of the substrate passing over the outlet will be located not more than 10 mm from the outlet whereby a layer of the material completely free from impurities can be continuously deposited on the surface of the moving substrate.

2. Apparatus according to claim 1, in which rail means for a rigid substrate constitute said substrate supporting means.

3. Apparatus according to claim 1, in which said crucible is formed of quartz, silver or graphite.

4. Apparatus according to claim 1, further comprising radiant heating means for said substrate disposed within said chamber and comprising a heating element out of direct communication with the interior of said chamber.

5. Apparatus according to claim 4, wherein said radiant heating means for said substrate is a halogen vapour lamp whose filament is encased in a quartz bulb.

* * * * *